United States Patent
Nastasi et al.

(10) Patent No.: US 6,572,933 B1
(45) Date of Patent: Jun. 3, 2003

(54) FORMING ADHERENT COATINGS USING PLASMA PROCESSING

(75) Inventors: Michael A. Nastasi, Espanola, NM (US); Kevin C. Walter, Los Alamos, NM (US); Donald J. Rej, Los Alamos, CA (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/160,227

(22) Filed: Sep. 24, 1998

Related U.S. Application Data

(60) Provisional application No. 60/059,928, filed on Sep. 24, 1997.

(51) Int. Cl.[7] .......................... H05H 1/24; C23C 14/14; C23C 14/48; C23C 14/58
(52) U.S. Cl. ................... 427/523; 427/530; 427/531; 427/576; 427/577; 204/192.16; 204/192.3
(58) Field of Search .............. 427/527, 529, 530, 531, 534, 539, 570, 574, 576, 577, 578, 579, 523; 204/192.16, 192.3

(56) References Cited

U.S. PATENT DOCUMENTS

| | | | |
|---|---|---|---|
| 4,764,394 A | | 8/1988 | Conrad |
| 4,957,773 A | * | 9/1990 | Spencer ..................... 427/570 |
| 5,198,263 A | * | 3/1993 | Stafford et al. ............. 427/570 |
| 5,289,010 A | | 2/1994 | Shohet .................. 250/492.21 |
| 5,296,272 A | | 3/1994 | Matossian et al. .......... 427/523 |
| 5,310,452 A | * | 5/1994 | Doki et al. .................. 427/570 |
| 5,316,804 A | * | 5/1994 | Tomikawa et al. .......... 427/570 |
| 5,330,800 A | | 7/1994 | Schumacher et al. ....... 427/523 |
| 5,374,456 A | | 12/1994 | Matossian et al. .......... 427/570 |
| 5,391,407 A | | 2/1995 | Dearnaley ................... 427/528 |
| 5,393,572 A | | 2/1995 | Dearnaley ................... 427/577 |
| 5,458,927 A | | 10/1995 | Malaczynski et al. ....... 427/527 |
| 5,518,780 A | * | 5/1996 | Tamor et al. ................ 427/570 |
| 5,576,071 A | * | 11/1996 | Sandhu ....................... 427/534 |
| 5,654,043 A | | 8/1997 | Shao et al. .................. 427/527 |
| 5,661,115 A | * | 8/1997 | Sandhu ....................... 427/534 |
| 5,747,116 A | * | 5/1998 | Sharan et al. ............... 427/533 |
| 5,750,210 A | * | 5/1998 | Schmidt et al. ............. 427/577 |

OTHER PUBLICATIONS

Lee et al "Internal stress reduction in diamond like Carbon Thin Films by Ion irradiation", *Nuclear Instruments & Meth. in Phys. Research* B 148; p. 216–220, 1999 no month.*

Lee et al "Inhomogeneous structure in hydrogenated tetrahedral amorphous carbon thin films"; *Phys. Rev. B*, vol. 59, No. 19; p. 12, 283–12,285, May 15, 1999.*

Franceschini et al "Structural modifications in a–C:H films doped & Implanted with Nitrogen" *Diamond & Related Materials*, 3; p. 88–93, 1993–no month.*

(List continued on next page.)

Primary Examiner—Marianne Padgett
(74) Attorney, Agent, or Firm—Samuel M. Freund

(57) ABSTRACT

Process for forming adherent coatings using plasma processing. Plasma Immersion Ion Processing (PIIP) is a process where energetic (hundreds of eV to many tens of keV) metallic and metalloid ions derived from high-vapor-pressure organometallic compounds in a plasma environment are employed to deposit coatings on suitable substrates, which coatings are subsequently relieved of stress using inert ion bombardment, also in a plasma environment, producing thereby strongly adherent coatings having chosen composition, thickness and density. Four processes are utilized: sputter-cleaning, ion implantation, material deposition, and coating stress relief. Targets are placed directly in a plasma and pulse biased to generate a non-line-of-sight deposition without the need for complex fixturing. If the bias is a relatively high negative potential (20 kV–100 kV) ion implantation will result. At lower voltages (50 V–10 kV), deposition occurs, and the extent of the surface modification can routinely be extended between 1 $\mu$m and 10 $\mu$m. By combining plasma based implantation and film deposition, coatings with greatly reduced stress are possible, allowing the ultimate coating thickness to be expanded to tens of microns.

15 Claims, 2 Drawing Sheets

OTHER PUBLICATIONS

Kulisch et al, "A Concept for the deposition of adherent cubic boron nitride films", *Thin Solid Films*; 377–378; p. 170–176, 2000–no month.*

Boyen et al, "Ion Beam assisted growth of C–BN films on top of C–BN substrates—a HRTEM Study" *Diamond and Related Materials* 11; p. 38–42, 2002–no month.*

Checchetto et al, "BN Coating adhesion on ion–implanted polymer surfaces" *Thin Solid Films*, 398–399; p. 222–227, 2001–no month.*

S. Fayeulle et al., "Ion Beam Induced Modifications in DC Sputtered TiN/B–C–N Multilayers," *Nucl. Instr. and Meth. in Phys. Res.* B 127/128, 198 (1997), no month, p. 198–202.

S. Fayeulle et al., "Thermal and Ion Irradiation Stability of Direct Current Sputtered TiN/B–C–N Multilayers," Appl. Phys. Lett. 70, 1098 (Mar. 1997), p. 1098–1100.

Sunwoo Lee et al., "The Structural Homogeneity of Boron Carbide Thin Films Fabricated Using Plasma–Enhanced Chemical Vapor Deposition from $B_5H_9+CH_4$," J. Appl. Phys. 74, 6919 (Dec. 1993), p. 6919–6924.

S. M. Gorbatkin et al., "Boron Nitride Thin Film Deposition Using Electron Cyclotron Resonance Microwave Plasmas," J. Vac. Sci. Technol. A11, 1863 (Jul./Aug. 1993), p. 1863–1869.

H. Windischmann, "Intrinsic Stress Scaling Law for Polycrystalline Thin Films Prepared by Ion Beam Sputtering," *J. Appl. Phys.* 62, 1800 (Sep. 1987), p. 1800–1807.

H. Windischmann, "Intrinsic Stress in Sputtered Thin Films," *J. Vac. Sci. Technol.* A9(4) (Jul./Aug. 1991), p. 2431–2436.

Nathan W. Cheung, "Plasma Immersion Ion Implantation for ULSI Processing," Nuclear Instruments and Methods in Physics Research, B55, 811–820 (1991), no month.

* cited by examiner

FORMING ADHERENT COATINGS USING PLASMA PROCESSING

This application claims priority from U.S. Provisional Application No. 60/059,928, filed Sep. 24, 1997.

FIELD OF THE INVENTION

The present invention relates generally to the formation of adherent coatings on substrates and, more particularly, to the formation of adherent coatings on substrates receptive to carbon, nitrogen or boron ion implantation. This invention was made with government support under Contract No. W-7405-ENG-36 awarded by the U.S. Department of Energy to The Regents of the University of California. The government has certain rights in the invention.

BACKGROUND OF THE INVENTION

Processing by plasma assisted techniques is increasingly used in various areas of production. One of the most promising uses is in the deposition of coatings. Such applications are expanding in response to requirements for lower processing temperatures, reduced environmental impact, and enhanced performance. To meet the needs of the civil and military industrial complexes, new and novel synthesis approaches must be scaleable, produce conformal coatings, be environmentally benign, and be economical to implement.

Many industries routinely utilize coatings and other surface treatments to reduce wear and improve corrosion resistance. A critical issue in traditional coatings is delamination or separation at interfaces due to poor chemical bonding and/or from excessive compressive stress that often accompanies thick coatings. Additionally, since molten metal and wet chemical baths are usually employed in conventional methods, presently used coating techniques generate dangerous vapors, utilize toxic materials, and pose environmental hazards related to the disposal of generated wastes. As a result, a new, innovative, and highly versatile implementation approach is required.

Potentially environmentally benign coating technologies (e.g., PVD, CVD, plasma sprays, and line-of-sight ion implantation) have been available for decades. In spite of their perceived flexibility and promise, traditional line-of-sight surface modification techniques are generally considered to be too expensive, too slow, and too complicated for mass production applications. For example, the deposit of diamond-like carbon coatings using line-of-sight implantation is described in U.S. Pat. No. 5,391,407 for "Process For Forming Protective Diamond-Like Carbon Coatings On Metallic Surfaces," which issued to Geoffrey Dearnaley on Feb. 21, 1995, and in U.S. Pat. No. 5,393,572 for "Ion Beam Assisted Method Of Producing A Diamond Like Carbon Coating," which issued to Geoffrey Dearnaley on Feb. 28, 1995.

Plasma Source Ion Implantation (PSII) is discussed by John R. Conrad in U.S. Pat. No. 4,764,394 for "Method And Apparatus For Plasma Source Ion Implantation," which issued on Aug. 16, 1988. Therein the implantation of ions into surfaces of three-dimensional targets is achieved by forming an ionized plasma about the target within an enclosing chamber and applying a pulse of high voltage between the target and the conductive walls of the chamber, whereby ions from the plasma are driven into the target object surfaces simultaneously from all sides. Plasma Source Ion Implantation has overcome many of the disadvantages of the conventional technologies, but in its present state, is limited to but a few gas sources. However, PSII technology has been successfully applied to improve the tribological properties of automotive parts in U.S. Pat. No. 5,458,927 for "Process For The Formation Of Wear- And Scuff- Resistant Carbon Coatings," which issued to Gerald W. Malaczynski et al. on Oct. 17, 1995. Therein, an adherent diamond-like carbon coating is formed on an aluminum substrate. However, there is no discussion in Malaczynski et al. concerning relieving the stress between the coating and the substrate which results from the coating process.

It is well known that plasma-generated coatings are intrinsically stressed. See, e.g., "Intrinsic Stress Scaling Law For Polycrystalline Thin Films Prepared By Ion Beam Sputtering," by H. Windischmann, J. Appl. Phys. 62, 1800 (1987), and "Intrinsic Stress In Sputtered Thin Films," by H. Windischmann, J. Vac. Sci. Technol. A 9, 2431 (1991). Such stress is expected to be in part responsible for poor film adhesion to substrates. However, in "Ion Beam Induced Modifications In DC Sputtered TiN/B-C-N Multilayers," by S. Fayeulle et al., Nucl. Instr. and Meth. in Phys. Res. B 127/128, 198 (1997), and in "Thermal And Ion Irradiation Stability Of Direct Current Sputtered TiN/B-C-N Multilayers," by S. Fayeulle et al., Appl. Phys. Lett. 70, 1098 (1997), ion beam irradiation of deposited surfaces using Ar ions has been found to relax the highly compressive stress initially present in multilayered, sputtered thin films of TiN/B-C-N to a small tensile stress. This should greatly improve the film adherence properties.

Boron carbide and boron nitride thin films have been deposited on surfaces using plasma techniques. See, e.g., "The Structural Homogeneity Of Boron Carbide Thin Films Fabricated Using Plasma-Enhanced Chemical Vapor Deposition From $B_5H_9+CH_4$," by Sunwoo Lee et al., J. Appl. Phys. 74, 6919 (1993), and "Boron Nitride Thin Film Deposition Using Electron Cyclotron Resonance Microwave Plasmas," by S. M. Gorbatkin et al., J. Vac. Sci. Technol. A 11, 1863 (1993), respectively.

Accordingly, it is an object of the present invention to overcome two fundamental limitations to the widespread use of environmentally friendly coating technologies by: (1) reducing the time and expense of treating complex shapes and large areas, and (2) extending the capabilities of deposition technologies to provide novel coatings with enhanced adherence and superior performance.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the method for forming an adherent coating on a substrate of this invention includes: applying a first, negative-pulsed bias voltage to the substrate; immersing the biased substrate in a plasma containing atoms which strongly bond to the coating, such that ions of the binding atoms are injected into the surface of the substrate, forming thereby a compositionally graded surface thereon; subsequently applying a second, negative-pulsed bias voltage to the substrate; immersing the substrate having the compositionally graded surface in a plasma containing gaseous precursor species which will form the desired coating on the surface thereof; applying a third pulsed, negative bias voltage to the coated substrate; and immersing the coated substrate in a plasma containing inert gas ions such that the stress experienced by the coating is reduced, whereby the coating strongly adheres to the surface of said substrate.

It is preferred that the coating is boron carbide and that the gaseous precursor species which generates the boron carbide coating on the surface of the substrate surface includes acetylene and diborane.

Preferably, the binding atoms injected into the surface of said substrate, forming thereby a compositionally graded surface thereon, are selected from the group consisting of carbon and boron.

It is also preferred that the first, negative-pulse bias voltage is between 10 kV and 100 kV, that the second, negative-pulse voltage is between 50 V and 10 kV, and that the third, negative-pulse bias voltage is between 10 kV and 100 kV.

Preferably also, the process steps are repeated, perhaps using different coating precursor species until a coating having the desired thickness and composition is achieved.

Benefits and advantages of the present invention include the deposition of a substantial variety of coatings having greater adherence than those generated by other techniques on numerous substrates. Additionally, the coating thickness and density can be controlled.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIGS. 1a and 1b illustrate the composition of the surface coating when the substrate is immersed in a plasma containing the precursor gaseous boron carbide species acetylene and diborane, FIG. 1a showing the atomic concentrations of the coating as a function of diborane flow relative to the total flow of reactant species, while FIG. 1b shows the boron to carbon ratio of the coating as a function of diborane flow rate relative to the total flow of reactant species.

DETAILED DESCRIPTION

Figures 1A, 1B:
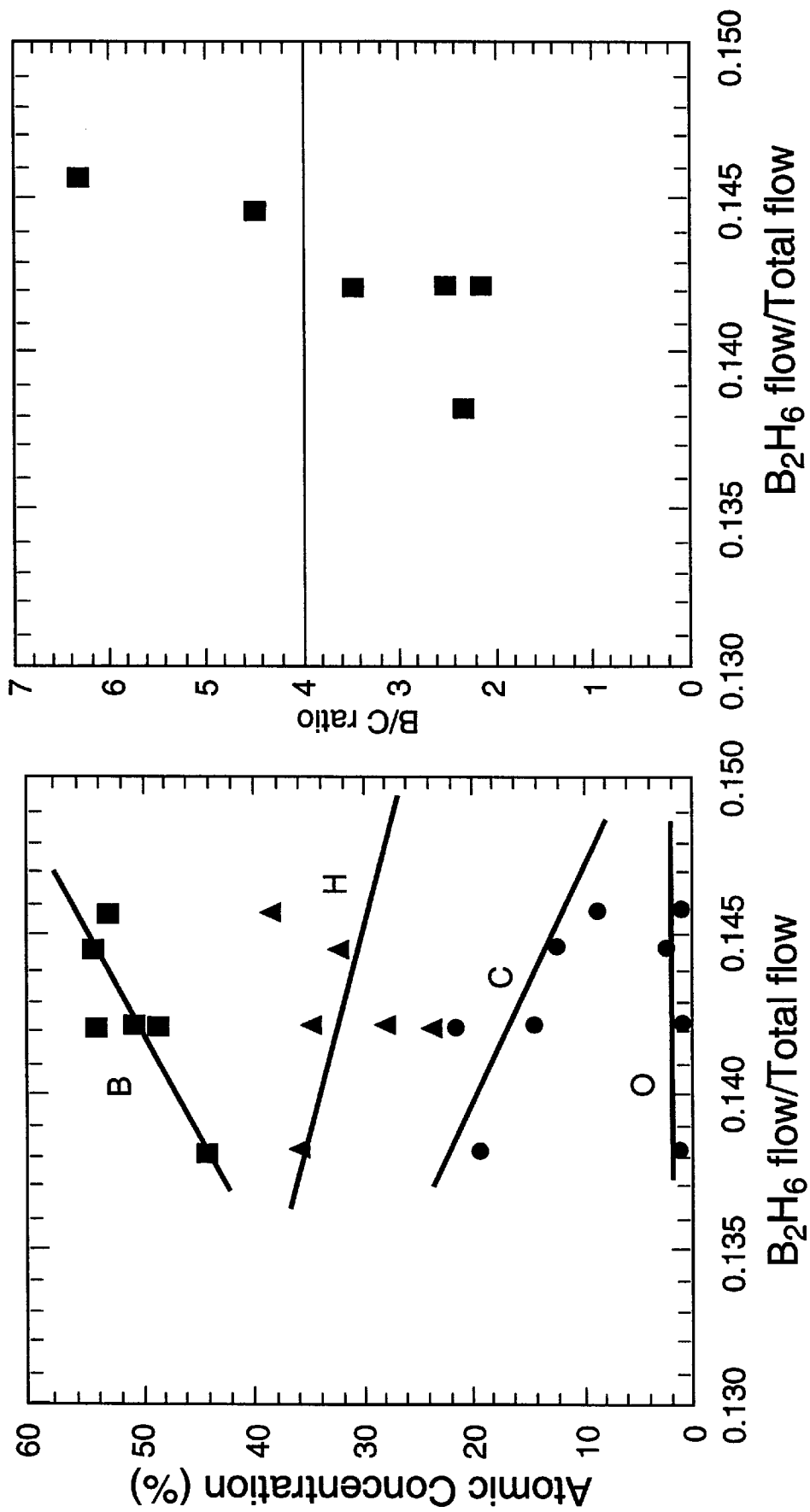

Briefly, the present invention includes the use of Plasma Immersion Ion Processing (PIIP), where energetic (hundreds of eV to many tens of keV) metallic and metalloid ions derived from high-vapor-pressure organometallic compounds in a plasma environment deposit coatings on suitable substrates, which coatings are subsequently relieved of stress using inert or other ion bombardment, also in a plasma environment, producing thereby strongly adherent coatings having chosen composition, thickness and density. Targets are placed directly in a plasma and pulse biased to generate a non-line-of-sight deposition without the need for complex fixturing. If the bias is a relatively high negative potential (20 kV–100 kV) ion implantation will result. At lower voltages (50 V–10 kV), deposition occurs, and the extent of the surface modification can routinely be extended between 1 $\mu$m and 10 $\mu$m. By combining plasma based implantation and film deposition, coatings with greatly reduced stress are possible, allowing the ultimate coating thickness to be expanded to tens of microns.

Plasma Immersion Ion Processing consists of four plasma-based processes for producing novel, adherent and conformal coatings on surfaces with complex shapes and/or materials and components that cannot be treated by conventional techniques because of size, lack of chemical reactivity, or temperature sensitivity. The four principal processes are sputter cleaning, ion implantation, material deposition, and coating stress relief, are described hereinbelow for a typical, yet generic, PIIP scenario. A fifth step of sputter cleaning the ion-implanted surface before a coating is deposited may also be introduced if the ion implantation step results in unwanted material being deposited on the surface. Note that steps 1 and 2 can be applied alone to provide ion implantation of non-typical ions (other than nitrogen, oxygen, hydrocarbons, or inert gases) for generating novel surface modifications that may not result in a coating.

Step 1. Sputter-cleaning of the surface. A component is first inserted into a vacuum chamber and the chamber evacuated to a suitable pressure ($10^{-6}$ to $10^{-5}$ Torr). Argon, or another inert gas, is introduced ($10^{-4}$ to 100 mTorr) and a plasma generated (by any means). The component is then negatively biased by imposing either rf-power or pulsed-power to the component. The described conditions result in ion bombardment of the component surface which causes sputtering (removal) of atoms and molecules on the surface of the component. The negative bias can have a range of magnitudes (from a few volts to a few tens of kilovolts), but is adjusted such that removal of surface atoms is accomplished and injection of the ions into the surface is minimized. The process is continued until the surface is in a condition such that the following steps can be successful. That is, Step 1 cleans the surface of contaminants that may inhibit, or otherwise interfere, with Step 2.

Step 2. Ion implantation to create a compositionally graded surface and promote coating adhesion, or to create a surface implanted with non-typical ions. After Step 1 is complete, the inert gas is evacuated from the vacuum chamber and the working gas, or mixture of gases, is introduced into the chamber. The total gas pressure can range from $10^{-5}$ to $10^{-2}$ Torr. The gas, or gas mixture, will contain atoms, or molecules containing atoms, that will bond strongly to the coating to be deposited in Step 4. In some situations, the gas will be composed of organometallic compounds alone, or a mixture of one or more organometallic compounds and/or other gases. A plasma is generated in the gas by any means. The component is negatively pulsed biased to a sufficiently high magnitude (10–100 kV) that the ions are injected into the component's surface and generate a compositionally graded surface as a result of the variation of ion energies in the plasma. This step is continued until the component bears a compositionally graded surface that will promote enhanced adhesion for the coating to be deposited in Step 4.

Step 3. Sputter-cleaning to remove undesirable surface contamination from Step 2. An undesirable side-effect of Step 2 may be the deposition of a thin surface coating that will interfere with the deposition and/or adhesion of the coating deposited in Step 4. This surface contamination can be removed using a sputter-cleaning process similar to Step 1. This process is continued until the surface is in a condition such that the following step can be successful. That is, Step 3 cleans the surface of contaminants that may inhibit, or otherwise interfere, with Step 4, but is not always required.

Step 4. Deposition of the coating. After Step 3, if necessary, is complete, the inert gas is evacuated from the vacuum chamber and the working gas, or mixture of gases, is introduced into the chamber. This gas may have some components in common with the gas used in Step 2, but may have entirely new species. The total gas pressure for Step 4 can range from 0.1 to 100 mTorr. The gas, or gas mixture, contains atoms, or molecules containing atoms, that will produce a coating with the desired composition. In some situations the gas may be composed of organometallic compounds alone, or a mixture of one or more organometallic compounds and/or gases. A plasma is generated in the gas by any means. The component is either rf-biased or pulsed biased to a magnitude (0.01–50 kV) such that the ions are deposited onto the component's surface, bond with the implanted atoms from Step 2, and/or the component atoms, and generate an adherent coating. The coating composition, density and other materials properties can be tailored by using different combinations of gas pressure and bias magnitude. Deposition is continued until a coating with sufficient thickness is created. In addition to simple homogenous coatings, the gas composition can be changed during deposition to produce multicomponent, or multilayered, composite coatings. If the compressive stress of the coating limits the thickness of an adherent coating to below a desired level, the following Step 5 can be used to reduce the coating stress. In many tribological and corrosion applications, thick coatings (>5 $\mu$m) are required.

Step 5. Ion implantation to reduce the stress in a coating. If the thickness of an adherent coating is limited by tensile or compressive stress, such stress can be relieved by an ion implantation process, thereby permitting coating deposition to continue until the desired coating thickness is achieved. This ion implantation process is similar to that of Step 2. Once the ion implantation reduces the coating's stress to a tolerable level, Step 4 can be repeated. Steps 4 and 5 can be repeated until the coating thickness reaches the desired value.

Having generally described the present invention, the following Example illustrates in more detail the generation of a boron carbide coating on an untreated silicon substrate using immersion of the substrate in a plasma containing diborane and acetylene precursor species.

EXAMPLE

Reference will now be made to the present preferred embodiments of the present invention examples of which are illustrated in the accompanying drawings. Boron carbide coatings were generated on a silicon substrate by immersing the substrate in a pulsed, glow-discharge plasma generated in a flowing mixture of diborane diluted in helium and acetylene at a pressure of 20 mTorr. The power supply for the substrate applied a 4 kV, negatively biased 4 kHz square wave having a 30 $\mu$s pulsewidth. This permitted generation of the plasma during the on cycle. A deposition rate of between 0.1 and 0.4 $\mu$m/hr, depending on the gas mixture, was observed. The resulting boron carbide coating had a hardness of between 12 and 13 GPa, and an elastic modulus between 115 and 140 GPa. Turning now to the Figures, FIGS. 1a and 1b illustrate the composition of the surface coating when the substrate is immersed in a plasma containing the precursor gaseous species acetylene and diborane, FIG. 1a showing the atomic concentrations of the coating as a function of diborane flow relative to the total flow of reactant species, while FIG. 1b shows the boron to carbon ratio of the coating as a function of diborane flow rate relative to the total flow of reactant species. It can be observed from FIG. 1a that there is a significant quantity of hydrogen incorporated in the coating. However, it is at present unknown how the hydrogen atoms are bound and what effect this has, on the overall properties of the coatings. The horizontal line in FIG. 1b shows the, location of the boron to carbon ratio of 4 on the graph. This is the stoichiometrically correct ratio for boron carbide ($B_4C$). This condition is achieved when the flowing gas mixture is about 14% diborane.

Figure 2B:
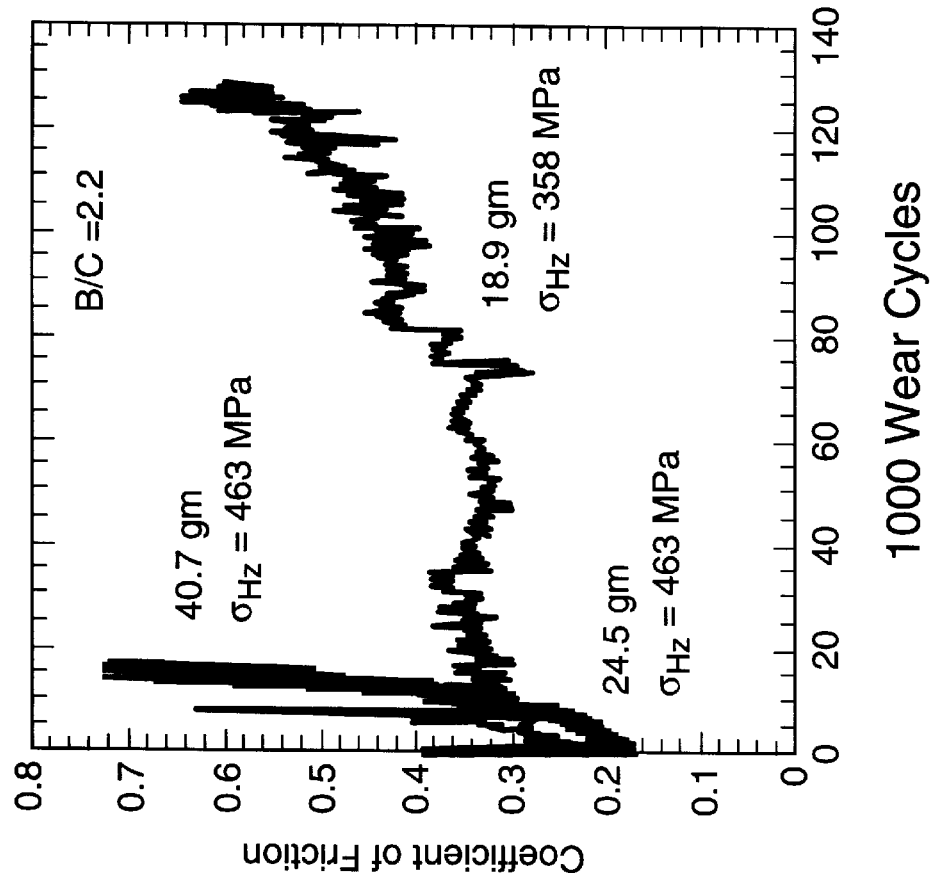
FIGS. 2a and 2b illustrate the friction characteristics of the boron carbide coating for several boron-to-carbon ratios using the pin-on-disk testing procedure (FIG. 2a), and several pin pressures for a boron-to-carbon ratio of 2.2 (FIG. 2b) as a function of the number of wear cycles.
Figure 2A:
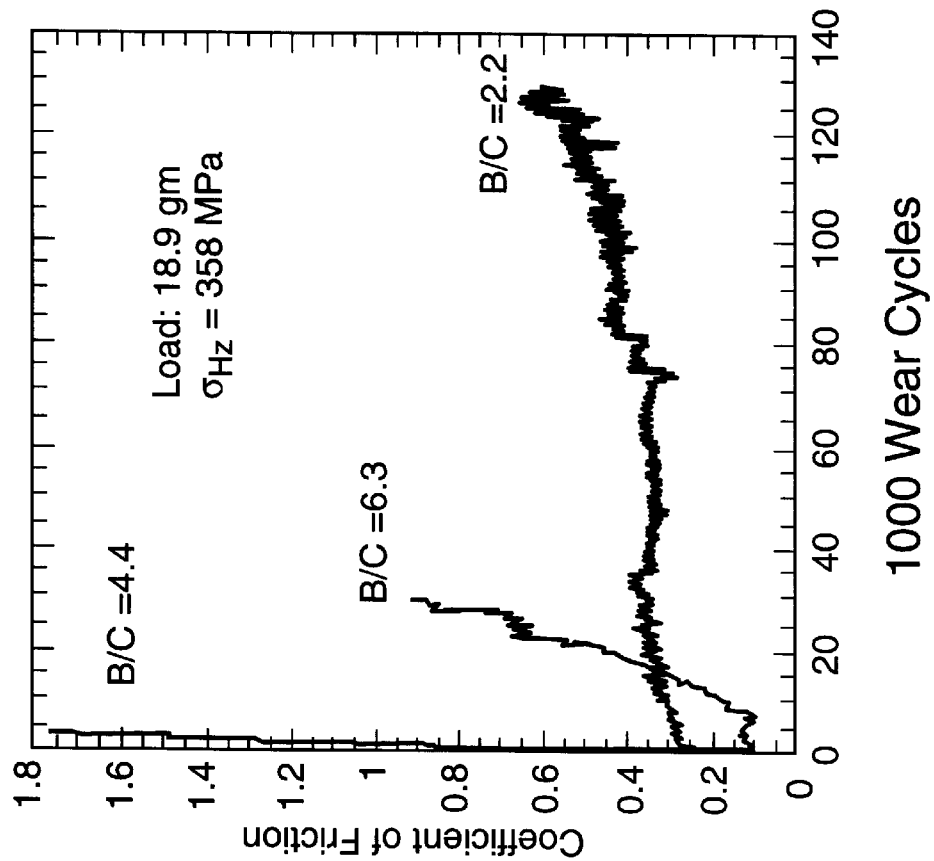

FIGS. 2a and 2b illustrate the wear characteristics of the boron carbide coating for several boron-to-carbon ratios using the pin-on-disk testing procedure (FIG. 2a), and several pin pressures for a boron-to-carbon ratio of 2.2 (FIG. 2b) as a function of the number of wear cycles. The values for $\sigma_{Hz}$ shown in the Figures represent the Herzian contact pressure of the pin on the coating surface. When the coefficient of friction is observed to suddenly increase, the coating is worn through. It may be seen from FIG. 2a that the coefficient of friction is relatively constant for a boron to carbon ratio of 2.2. FIG. 2b shows the effect of various pin weightings on the wear properties of the coating for this boron to carbon ratio.

In general, precursor species are chosen to provide optimum tribological and/or corrosion properties for a variety of applications. Many metal-organic precursors are commercially available. For example, $M(NR_2)_4$ (M=Ti, Zr, Hf) have been used as single source precursors for the plasma-enhanced chemical vapor deposition (PECVD) of $MC_xN_y$ materials. For PIIP, these complexes are ideal for the growth of conformal metal-nitride or metal-carbonitride coatings. The present inventors have determined that PSII can be used to produce adherent diamond-like coatings on a wide range of metal substrates including Mg, Al, Si, Ti, Cr, Fe, Ni, Cu-Zn (brass) and W without the use of interlayers. This strongly suggests that PIIP can be used with numerous coating precursor species on numerous target substrates. The tandem process of first performing an ion implantation of a particular group of metal organic compounds followed by energetic deposition of the same ion species, will give rise to a functionally graded interface which will have superior adhesion and reduced sensitivity to thermal expansion mismatches between substrate and coating. An advantage of metal organic precursors is their high volatility, which translates into high chamber fill pressures and plasma densities which, in turn, enables high ion currents and growth rates. Many precursors currently exist and are listed in the TABLE. It should be mentioned at this point that other atomic or molecular species may be utilized to generate the compositionally graded surface than are used for the coating deposition.

TABLE

Volatile Organometallic Complexes for PIIP Processing

| Complex | Implanted Species or Film Deposited |
|---|---|
| $AlH_3.N(CH_3)_3$, $AlH_3.N(CH_2CH_3)_3$, | Al, AlN |
| $M[CH_2C(CH_3)_3]_4$ (M = Ti, Zr, Hf, Cr) | metal carbides |
| $M[NC(CH_3)_2]_4$ (M = Ti, Zr, Hf, Sn, Si) | metal carbonitrides |
| $M[OCH(CH_3)_2]_4$ (M = Ti, Zr, Hf) | metal oxycarbides |
| $B_3N_3H_6$ | BN |
| $Cr(CO)_6$ | chromium oxycarbide |
| $V(C_2H_3O_2)_3$ | vanadium oxycarbide |

When a component is initially placed into the PIIP chamber, plasma-based processes will be used for sputter and plasma cleaning of surfaces. Such cleaning processes provide an additional environmental benefit by serving as alternatives to cleaning using solvents. In PIIP, components are placed directly in a plasma and then pulse-biased to produce a non-line-of-sight process capable of treating intricate target geometries without complicated fixturing and manipulation of the components. Initially, the bias is a relatively high negative potential (10 kV–100 kV) resulting in ion implantation and the formation of a compositionally and functionally graded layer at the substrate surface. This ion-modified surface layer may stand alone, or might serve to enhance adhesion of subsequently deposited coatings. Second, lower voltages (10 V–50 kV) will be applied for deposition to occur. The coating thickness is limited by adhesion to the substrate, and the magnitude of intrinsic stress in coating. Finally, and if necessary, additional ion implantation (at between 10 kV–100 kV) into the coatings will relieve the intrinsic stress to acceptable levels and allow additional deposition. By this unique combination of plasma-based implantation and coating deposition processes, coatings with superior adhesion and greatly reduced stress will be possible, allowing the ultimate coating thickness to extend into the many tens of microns range.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for forming an adherent coating on a substrate comprising the steps of:
   (a) applying a first, negative-pulsed bias voltage to the substrate and immersing the biased substrate in a plasma containing atoms which bond to the coating, such that ions of the atoms which bond to the coating are formed in the plasma and are injected into the surface of the substrate, forming thereby a compositionally graded surface thereon;
   (b) thereafter applying a second, negative-pulsed bias voltage to the substrate having the compositionally graded surface and immersing the substrate having the compositionally graded surface in a plasma containing gaseous precursor species, thereby forming an initial coating on the surface thereof; and
   (c) thereafter applying a third pulsed, negative bias voltage to the initial coated substrate and immersing the initial coated substrate in a plasma containing inert gas ions such that intrinsic stress experienced by the initial coating is reduced, whereby the adherent coating is formed on the surface of the substrate.

2. The method for forming an adherent coating on a substrate as described in claim 1, wherein the coating is boron carbide and wherein the gaseous precursor species which give rise to said boron carbide coating on the surface of the substrate having the compositionally graded surface comprises acetylene and diborane.

3. The method for forming an adherent coating on a substrate as described in claim 2, wherein the binding atoms injected into the surface of the substrate, forming thereby the compositionally graded surface thereon, are selected from the group consisting of carbon and boron.

4. The method for forming an adherent coating on a substrate as described in claim 1, wherein the first, negative-pulse bias voltage is between 10 kV and 100 kV and the second, negative-pulse bias voltage is between 50 V and 10 kV.

5. The method for forming an adherent coating on a substrate as described in claim 1, further comprising the steps of continuously, negatively biasing the substrate having the compositionally graded surface at a fourth voltage and immersing the substrate in an inert gas plasma after said step of injecting the ions of the atoms which bond to the coating into the surface of said substrate and before said step of forming the coating on the surface thereof, whereby any surface contamination resulting from said step of forming the compositionally graded surface is removed by sputter cleaning.

6. The method for forming an adherent coating on a substrate as described in claim 5, wherein the fourth negative biasing voltage is between 1 V and 50 kV.

7. The method for forming an adherent coating on a substrate as described in claim 1, further comprising the steps of continuously, negatively biasing the untreated substrate at a fifth voltage and immersing the substrate in an inert gas plasma before said step of injecting the ions of the atoms which bond to the coating into the surface of the substrate, whereby the surface is sputter cleaned.

8. The method for forming an adherent coating on a substrate as described in claim 7, wherein the fifth negative biasing voltage is between 1 V and 50 kV.

9. The method for forming an adherent coating on a substrate as described in claim 1, wherein the substrate is silicon.

10. The method for forming an adherent coating on a substrate as described in claim 1, wherein the substrate is maintained at a temperature between 0° C. and 350° C. during said steps (a)–(c).

11. The method for forming an adherent coating on a substrate as described in claim 1, wherein the coating is boron nitride and wherein the gaseous precursor species which deposit the boron nitride coating on the surface of the substrate having the compositionally graded surface are selected from the group consisting of $B_3N_3H_6$, $B_3N_3H_6$ plus $NH_3$, $B_3N_3H_6$ plus $N_2$, $B_2H_6$ plus $N_2$, and $B_2H_6$ plus $NH_3$.

12. The method for forming an adherent coating on a substrate as described in claim 11, wherein the ions of the atoms which bond to the coating injected into the surface of the substrate, forming thereby the compositionally graded surface thereon, are selected from the group consisting of nitrogen and boron.

13. The method for forming an adherent coating on a substrate as described in claim 1, wherein the third pulsed, negative bias voltage is between 10 kV and 100 kV.

14. The method for forming an adherent coating on a substrate as described in claim 1, wherein the inert gas ions include argon.

15. The method for forming an adherent coating on a substrate as described in claim 1, wherein said steps a–c are repeated until a final coating having a desired thickness is obtained.

* * * * *